(12) United States Patent
Mohamadi (10) Patent No.: US 7,843,992 B2
(45) Date of Patent: Nov. 30, 2010

(54) GLOBAL INSTRUCTION BROADCASTING FOR PULSE-POSITION MODULATED DATA TRANSMISSION

(76) Inventor: Farrokh Mohamadi, 8 Halley, Irvine, CA (US) 92612-3797

( * ) Notice: Subject to any disclaimer, the term of this patent is extended or adjusted under 35 U.S.C. 154(b) by 863 days.

(21) Appl. No.: 11/672,504

(22) Filed: Feb. 7, 2007

(65) Prior Publication Data

US 2010/0246659 A1  Sep. 30, 2010

(51) Int. Cl.
*H03K 7/04* (2006.01)

(52) U.S. Cl. .................. 375/239; 343/853; 343/850; 343/852; 343/858; 343/859; 343/860; 343/861; 370/213

(58) Field of Classification Search ............ 375/130, 375/295, 239; 343/853, 850, 852, 858–861; 342/368; 333/128; 341/144; 370/338, 213
See application file for complete search history.

(56) References Cited

U.S. PATENT DOCUMENTS

| | | | | |
|---|---|---|---|---|
| 6,515,622 | B1 * | 2/2003 | Izadpanah et al. | 342/368 |
| 7,283,595 | B2 * | 10/2007 | Jun | 375/295 |
| 7,312,763 | B2 * | 12/2007 | Mohamadi | 343/853 |
| 7,394,866 | B2 * | 7/2008 | McCorkle | 375/295 |
| 7,683,852 | B2 * | 3/2010 | Mohamadi | 343/853 |
| 2003/0161411 | A1 * | 8/2003 | McCorkle et al. | 375/295 |
| 2004/0160293 | A1 * | 8/2004 | Ko et al. | 333/128 |
| 2005/0075080 | A1 * | 4/2005 | Zhang | 455/73 |
| 2006/0039449 | A1 * | 2/2006 | Fontana et al. | 375/130 |
| 2008/0130685 | A1 * | 6/2008 | Rogerson et al. | 370/478 |
| 2008/0252546 | A1 * | 10/2008 | Mohamadi | 343/853 |

OTHER PUBLICATIONS

Poulton, J. et al., A Tracking Clock Recovery Receiver for 4Gb/s Signaling, Hot Interconnects V Symposium Record, Aug. 1997, p. 157-169, Stanford.
Farjad-Rad, R., et al., An Equalization Scheme for 10Gb/s 4-PAM Signaling Over Long Cables, Mixed Signal Conference, Jul. 1997, Cancun, Mexico.

(Continued)

*Primary Examiner*—Mohammad H Ghayour
*Assistant Examiner*—Eboni Giles
(74) *Attorney, Agent, or Firm*—Haynes & Boone, LLP.

(57) ABSTRACT

In one embodiment, a circuit is provided that includes: an impulse generator operable to provide a pulse train; a pulse position modulator having a splitting junction configured to receive the pulse train, the pulse position modulator including a plurality of n transmission lines, wherein n is an integer, the n transmission lines being selectably coupled in parallel between the splitting junction and a combining junction, the impulse generator driving each transmission line having a unique delay such that if the transmission line is selected, each pulse received at the splitting junction is uniquely delayed into a delayed pulse, whereby if all the transmission lines are selected, each pulse received at the splitting junction is uniquely delayed into a corresponding plurality of n delayed pulses; and a controller operable to select the transmission lines responsive to received words of n bits in length, each word arranged from a first bit to an nth bit, and wherein the transmission lines are arranged from a first transmission line to an nth transmission line corresponding to the bits in the received words such that a given bit in a received word controls the selection of the corresponding transmission line.

14 Claims, 8 Drawing Sheets

OTHER PUBLICATIONS

Widmer, A.X. et al., Single-chip 4*500-MBd CMOS Transceiver, IEEE Journal of Solid-State Circuits, Dec. 1996, p. 2004-2014, vol. 31, No. 12.

Fiedler, A. et al., A 1.0625 Gbps Transceiver with 2x-Oversampling and Transmit Signal Pre-emphasis, IEEE International Solid-State Circuits Conference, 1997, p. 238-239.

Dally, W.J. et al., Transmitter Equalization for 4-Gbps Signaling,. IEEE Micro, Jan.-Feb. 1997, p. 48-56, vol. 16 No. 1.

Kim, S., B. Lee, D. Neikirk, Compact Equivalent Circuit Models for the Skin Effect, http://weewave.mer.utexas.edu/, 1996, University of Texas at Austin.

Yukawa, A. et al., A CMOS 8-bit High Speed A/D Converter IC, Proceedings of the Tenth European Solid-State Circuits Conference, Jun. 1985, p. 193-196.

Farrokh Mohamadi, http://grouper.ieee.org/groups/802/3/ae/public/may00/mohamadi_1_0500.pdf, IEEE meeting, May 2000.

M.M. Green, et al., OC-192 Transmitter in Standard 0.18u-m CMOS, ISSCC Digest of Technical Papers, 2002, p. 248-249.

J. Zerbe, et al., A 2Gb/s/pin 4-PAM Parallel Bus Interface with Crosstalk Cancellation, Equalization, and Integrating Receivers, ISSCC Digest of Technical Papers, 2001, p. 66-67.

R. Farjad-Rad et al., IEEE J. Solid-State Circuits, May 2000, p. 757-764, vol. 35.

C.K. Yang et al., A Serial-Link Tranceiver Based on 8-G Samples/s A/D and D/A Converters in .25-um CMOS, IEEE J. Solid State Circuits, Nov. 2001, p. 1684-1692, vol. 36.

K. Chang, et al., A .4-4Gbb/s CMOS Quad Tranceiver Cell Using On-Chip Regulated Dual-Loop PLLs, 2002 Symposium on VLSI Circuits Digest of Technical Papers, p. 88-91.

SDMG13, 3 Gbits/s-6.25 Gbits Serializer/Deserializer, Data Sheet, Agere Corporation, May 2003.

J. Zerbe, et al., Equalization and Clock Recovery for a 2.5-10Gbs 2-PAM/4-PAM Backplane, ISSCC 2003, Paper 4.6.

C. Mick, http://grouper.ieee.org/groups/802/3/tutorial/march98/mick_170398.pdf, IEEE meeting, Mar. 1998.

http://www.ieee802.org/802_tutorials/nov03/10GBASE-T%20tutorial.pdf, IEEE Meeting, Nov. 2003.

B. Jones, http://grouper.ieee.org/groups/802/3/10GBT/public/jan03/jones_2_0103.pdf, IEEE Meeting, Jan. 2003.

Farrokh Mohamadi, Critical Data Timing in Distributed Systems, Defense Electronics, May 2004, p. 13-18.

Farrokh Mohamadi, Si Integration with Millimeter Wave Phased Array Antenna, RF Design, Feb. 2004, p. 40-48.

* cited by examiner

GLOBAL INSTRUCTION BROADCASTING FOR PULSE-POSITION MODULATED DATA TRANSMISSION

TECHNICAL FIELD

The disclosure relates generally to signal transmission and more particularly to the control of data transmission through pulse position modulation.

BACKGROUND

Ultra-wideband wireless communication has great promise in that high data rates may be achieved using a relatively low power transmitter. Ultra-wideband wireless communication may also be denoted as impulse radio because of its use of very short pulses (approximately 1 nanosecond or less). By varying individual pulse positions within a waveform of such pulses, high-data-rate information may be transmitted using very low average power such as in the milliwatt range.

Much interest has been generated for impulse radio because of its low power consumption, extremely high data rate, and excellent multipath immunity. By integrating impulse radio with beamforming capabilities, very low probability of detection performance may be achieved. In contrast to mechanically steered antennas, electronically-controlled beamforming systems are lighter, more agile, and more reliable. A key element of beamforming systems is the design of the phase shifter, which is conventionally implemented using a monolithic microwave integrated circuit (MMIC). However, MMICs are costly and introduce a relatively high insertion loss. As a result, Micro-Electro-Mechanical-Systems (MEMS)-based phase shifters have been developed. But MEMS-based phase shifters are not compatible with conventional semiconductor processes. Moreover, regardless of whether beamforming is provided, the generation of impulses has proven to be extremely difficult to master.

U.S. application Ser. No. 11/555,210 discloses an advantageous pulse generation architecture that can achieve pulse widths of just tens of picoseconds or smaller. By transmitting such pulses in a high-gain directed beam, the range and signal-to-noise limitations of ultra wideband communication are reduced. However, the necessary control signals such as the beamforming commands as well as the data-to-be-transmitted need to be supplied to the pulse generator/modulator.

Accordingly, there is a need in the art for improved control of pulse-position-modulated ultra wideband radio communications.

SUMMARY

In accordance with an embodiment of the invention, a circuit is provided that includes: an impulse generator operable to provide a pulse train; a pulse position modulator having a splitting junction configured to receive the pulse train, the pulse position modulator including a plurality of n transmission lines, wherein n is an integer, the n transmission lines being selectably coupled in parallel between the splitting junction and a combining junction, the impulse generator driving each transmission line having a unique delay such that if the transmission line is selected, each pulse received at the splitting junction is uniquely delayed into a delayed pulse, whereby if all the transmission lines are selected, each pulse received at the splitting junction is uniquely delayed into a corresponding plurality of n delayed pulses; and a controller operable to select the transmission lines responsive to received words of n bits in length, each word arranged from a first bit to an nth bit, and wherein the transmission lines are arranged from a first transmission line to an nth transmission line corresponding to the bits in the received words such that a given bit in a received word controls the selection of the corresponding transmission line.

In accordance with another embodiment of the invention, a wafer scale antenna module (WSAM) is provided that includes: a substrate, a plurality of antennas adjacent the substrate; and an RF feed network adjacent the substrate, the RF feed network coupling to a distributed plurality of amplifiers integrated with the substrate, wherein the RF feed network and the distributed plurality of amplifiers are configured to form a resonant network such that if a timing signal is injected into an input port of the RF feed network, the resonant network oscillates to provide a globally synchronized RF signal to a plurality of integrated antenna circuits, wherein each integrated antenna circuits includes a corresponding subset of antennas from the plurality of antennas, and wherein each integrated antenna circuit includes: an impulse generator having a plurality of delay paths, each delay path having a unique delay, the impulse generator being configured to rectify and level shift the globally synchronized RF signal through the delay paths to provide a pulse train; a pulse position modulator having a splitting junction configured to receive the pulse train, the pulse position modulator including a plurality of n transmission lines, wherein n is an integer, the n transmission lines being selectably coupled in parallel between the splitting junction and a combining junction, the impulse generator driving each transmission line having a unique delay such that if the transmission line is selected, each pulse received at the splitting junction is uniquely delayed into a delayed pulse, whereby if all the transmission lines are selected, each pulse received at the splitting junction is uniquely delayed into a corresponding plurality of n delayed pulses; and a controller operable to select the transmission lines responsive to received words of n bits in length, each word arranged from a first bit to an nth bit, and wherein the transmission lines are arranged from a first transmission line to an nth transmission line corresponding to the bits in the received words such that a given bit in a received word controls the selection of the corresponding transmission line, wherein each integrated antenna circuit is operable to drive the delayed pulses from its pulse position modulator into its corresponding subset of antennas.

The invention will be more fully understood upon consideration of the following detailed description, taken together with the accompanying drawings.

Embodiments of the present invention and their advantages are best understood by referring to the detailed description

DETAILED DESCRIPTION

Reference will now be made in detail to one or more embodiments of the invention. While the invention will be described with respect to these embodiments, it should be understood that the invention is not limited to any particular embodiment. On the contrary, the invention includes alternatives, modifications, and equivalents as may come within the spirit and scope of the appended claims. Furthermore, in the following description, numerous specific details are set forth to provide a thorough understanding of the invention. The invention may be practiced without some or all of these specific details. In other instances, well-known structures and principles of operation have not been described in detail to avoid obscuring the invention.

An ultra wideband pulse generator and pulse-position modulator is provided that incorporates the pulse shaping advances disclosed in U.S. application Ser. No. 11/454,915 to provide a UWB radar having pulse widths of just tens of picoseconds. However, such extremely narrow pulses will be dispersed if transmitted through a transmission network such as a coplanar waveguide (CPW) network before being propagated by an associated transmitter's antennas.

To avoid this dispersion, embodiments of the disclosed pulse generator and pulse-position modulator use the distributed oscillator architecture disclosed in U.S. application. Ser. No. 11/536,625, filed Sep. 28, 2006, the contents of which are incorporated by reference. In this fashion, a wafer scale (integrated with a semiconductor wafer) pulse generator and pulse-position modulator is enabled in which a resonant transmission network with distributed amplification is driven by a triggering pulse waveform such that the entire transmission network oscillates acting as a distributed oscillator. Advantageously, the RF signal from the resulting distributed oscillator thereby arrives synchronously at a plurality of integrated antenna circuits coupled to the distributed oscillator. Each integrated antenna circuit may include a pulse generator and pulse-position modulator as will be described further herein. In this fashion, ultra wideband pulses may be propagated from the resulting wafer scale antenna module without incurring dispersion caused by propagation of the pulses through a transmission network. Significantly, however, such ultra wideband pulses may be generated without the need for oscillators such as a voltage controlled oscillator (VCO) in each integrated antenna circuit.

As set forth in U.S. application Ser. No. 11/536,625, a particularly advantageous transmission network with regard to a wafer scale approach is a coplanar waveguide (CPW) network. Although embodiments of the disclosed pulse generator and pulse-position modulator include the use of any suitable architecture for a transmission network such as CPW, microstrip, and planar waveguide, CPW enjoys superior shielding properties over microstrip. Thus, the following discussion will assume without loss of generality that the transmission network is implemented using CPW. This network may be arranged in an "H" array such that the electrical length from an RF input port to any given integrated antenna circuit is the same as that to all the remaining integrated antenna circuits. Although CPW has superior shielding properties, the RF propagation across a CPW network on a semiconductor wafer such as an 8" wafer may introduce losses as high as 120 dB. To counteract such losses, a plurality of distributed amplifiers may be coupled to the CPW network as disclosed in U.S. application Ser. No. 11/141,283. For example, a first linear transistor amplifier (which may be denoted as a driving amplifier) amplifies a received RF signal into a length of the CPW network into a second linear transistor amplifier (which may be denoted as a matching amplifier) configured to match its output impedance to the characteristic impedance of the CPW network. Both the gain of the driving amplifier and the gain and the output impedance of the matching amplifier are tuned using reactive loads such as integrated inductors. In this fashion, resistive losses are minimized. These gains may be maintained so that linear operation is achieved. In this fashion, an RF signal driven into an input port of the CPW network is linearly amplified and propagated to the integrated antenna circuits, despite the transmission line losses.

As disclosed in U.S. application Ser. No. 11/536,625, it has been observed that the combination of the resulting active devices and the transmission network can be tuned to form a resonant network. Because the network is resonant, a globally-synchronized oscillation can be induced by triggering the network with an appropriate timing signal. The distributed amplifiers thus injection lock to each other such that the resonant network forms a distributed oscillator providing each integrated antenna circuit with a globally synchronized sinusoidal RF signal. This sinusoidal RF signal may then be rectified in an impulse generator discussed herein to provide an unmodulated pulse train. The unmodulated pulses may then be pulse-position modulated. In addition, the resulting pulse-position modulated pulse train received at the antennas may be phase shifted for beamforming purposes using a phase shifter such as the analog phase shifter in U.S. application Ser. No. 11/535,928 (the contents of which are incorporated by reference) or any other suitable phase shifter such as disclosed in U.S. application. Ser. No. 11/182,344.

Figure 1:
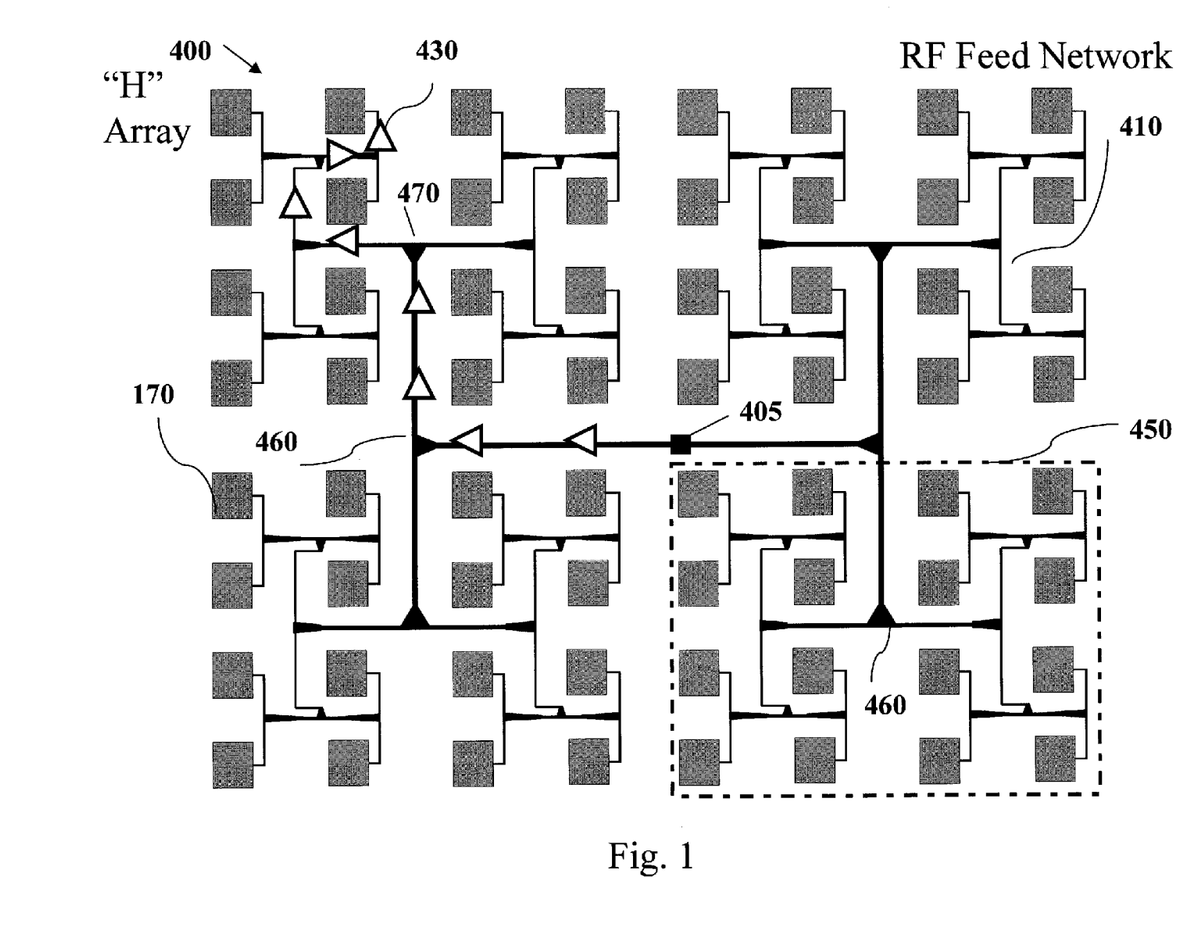
FIG. 1 is an illustration of a wafer scale resonant transmitting network.

Turning now to FIG. 1, a resonant half-duplex transmission network 410 for an 8×8 subarray of antenna elements 170 is implemented in an 8" wafer scale radar module 400. The triggering signal to trigger the resonant oscillation is injected into a center feed point 405. Distributed amplifiers 430 coupled to the network then injection lock to each other such that each antenna 170 may receive a globally synchronized RF signal. The transmission network may be single-ended or differential. In one embodiment, the network may comprise a coplanar waveguide (CPW) having a conductor width of a few microns (e.g., 4 microns). With such a small width or pitch to the network, an array of antenna elements may be readily networked in an 8 inch wafer substrate for, for example, 60 GHz data transmission.

Figure 2:
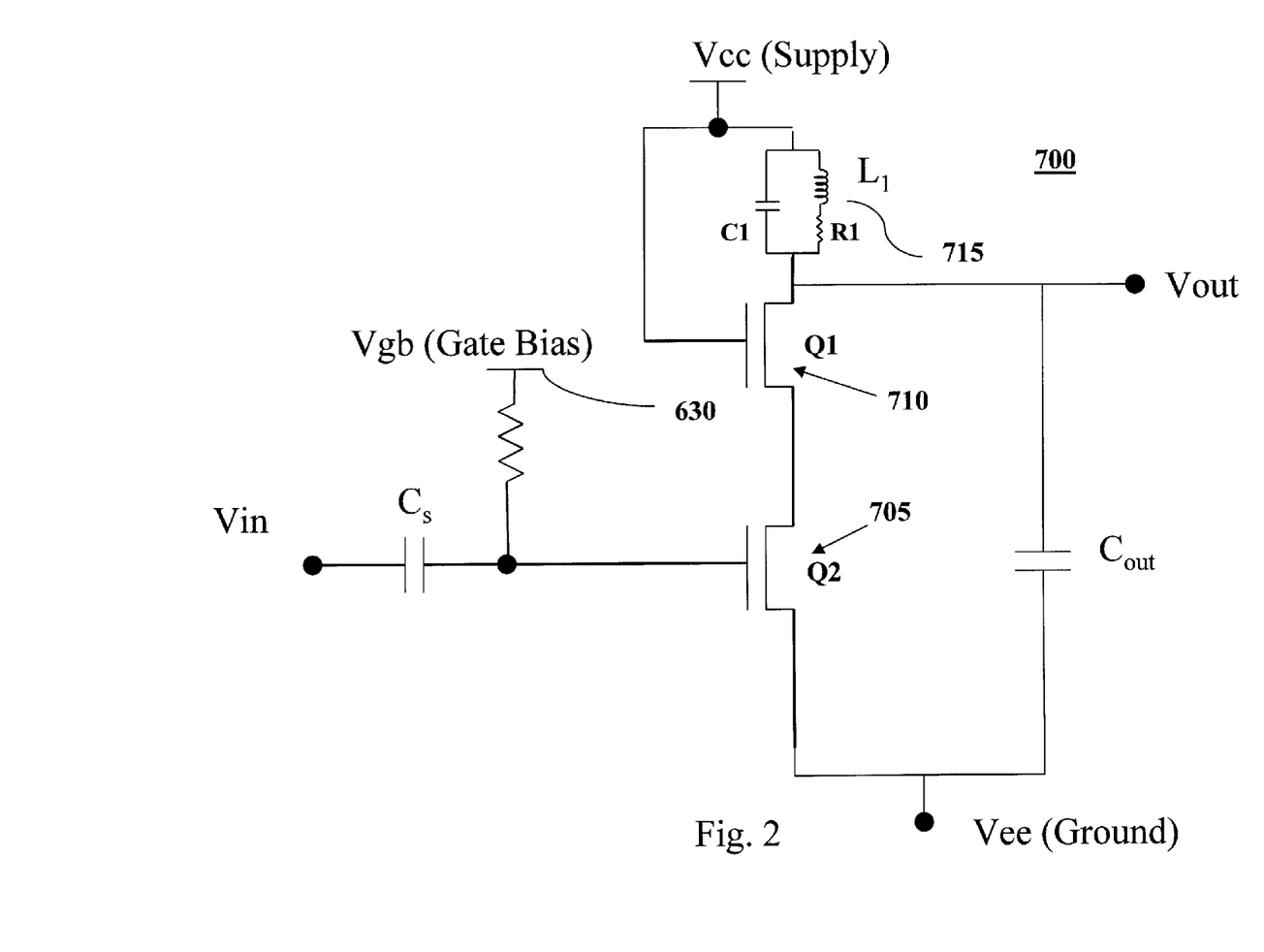
FIG. 2 is a schematic illustration of an amplifier for the resonant transmitting network of FIG. 1.

The design of the distributed amplifiers is not critical so long as they provide sufficient amplification and achieve a resonant operation with the transmission network. An exemplary amplifier 700 is illustrated in FIG. 2. Amplifier 700 uses NMOS FETs Q1 710 and Q2 705 although it will be appreciated that an analogous PMOS or bipolar-based amplifier may also be implemented. The source of transistor Q1 couples to the drain of transistor Q2. The drain of Q1 couples to an output voltage node Vout and also to an inductor L1. Inductor L1 may be implemented using the metal layers in the semiconductor process used to form amplifier 700 as discussed in U.S. Pat. No. 6,963,307, the contents of which are incorporated by reference. The parasitic capacitance and resistance of inductor L1 are illustrated conceptually as resistor R1 and capacitor C1. An opposing terminal of inductor L1 couples to a supply voltage node Vcc that also couples to the gate of transistor Q1. An input voltage node Vin couples through a capacitor Cs to the gate of transistor Q2. The gate of transistor Q2 is biased by a voltage source 630 that provides a gate bias voltage Vgb. In a bipolar-based embodiment, voltage source 630 would be replaced by a current source. Each field effect transistor would be replaced by a bipolar transistor of the appropriate doping. For example, NMOS transistors such as Q1 and Q2 would be replaced by corresponding NPN bipolar transistors. It will be appreciated that amplifier 700 may also be constructed using PNP bipolar transistors or corresponding p-channel transistors (in a FET-based embodiment. Such dual embodiments (bipolar NPN or PNP, n-channel FET or p-channel FET) may be constructed for all the amplifiers disclosed herein. The source of transistor Q2 is optionally loaded by an inductor L2 (not illustrated). Capacitor Cs and inductor L2 may be formed using semiconductor process metal layers as discussed for inductor L1. The values of the various inductances and capacitances depend upon the impedance of the corresponding resonant transmission network, the dimensions of the transistors, and the operating frequency. For example, in a FET-based embodiment having transistor channel dimensions of 2 microns by 0.12 micron, Cs may have a capacitance of 80 fF, L1 may have an inductance of 80-100 pH (for 40 or 60 GHz operation, respectively), and L2 may have an inductance approximately $\frac{1}{10}^{th}$ that of L1. As discussed analogously in, for example, U.S. application Ser. No. 11/536,625, each amplifier is integrated onto the semiconductor substrate (or semiconductor wafer) that supports the resonant integrated network. Similarly, the beam-forming units are also integrated onto the substrate. The antennas may be formed in either a "backside" or "frontside" implementation as discussed in U.S. application Ser. No. 11/567,650, filed Dec. 6, 2006, the contents of which are incorporated by reference.

Figure 3:
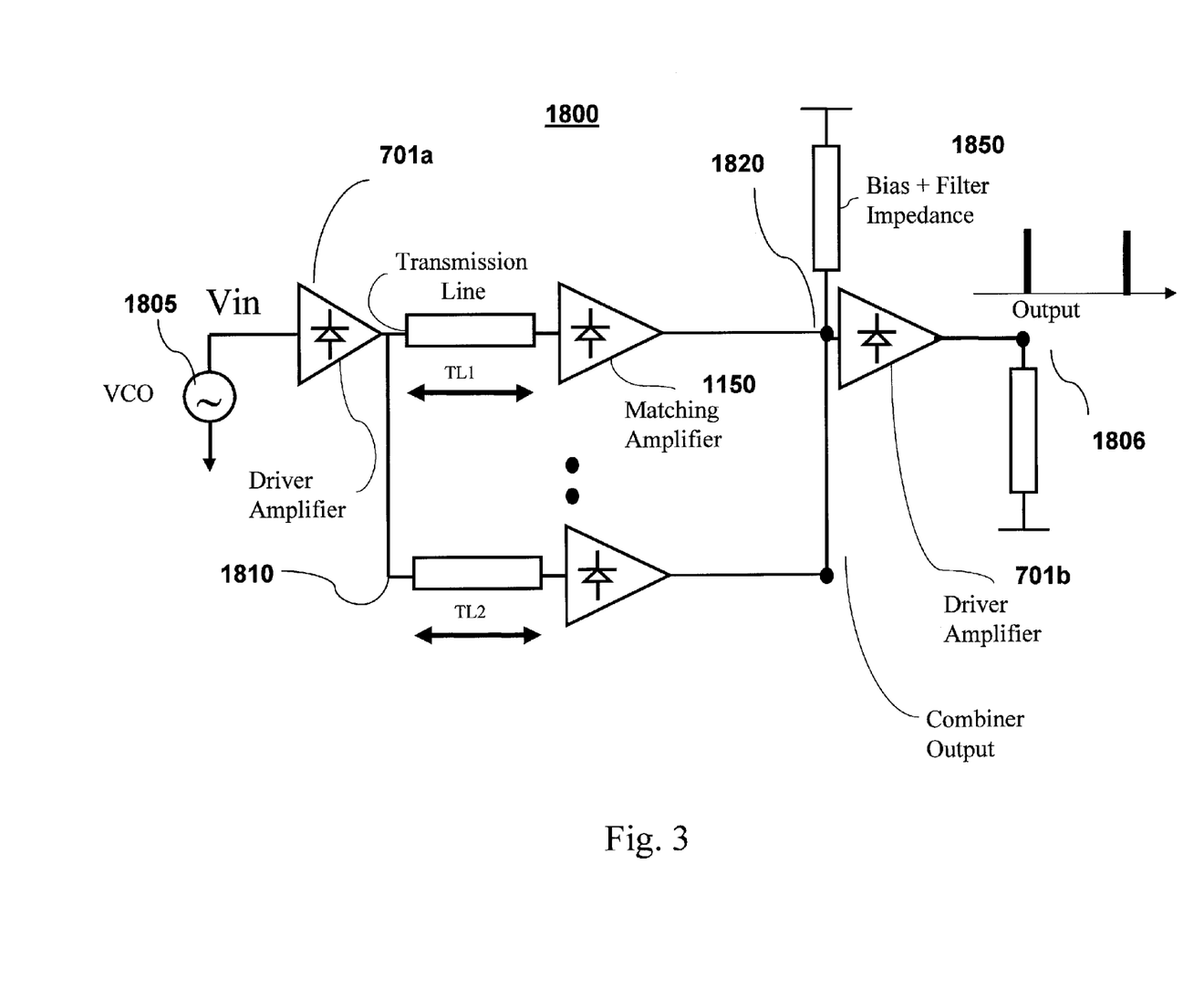
FIG. 3 is a schematic illustration of an impulse generator.

The resulting resonant transmission network will sinusoidally oscillate in unison. The result is a globally synchronized sinusoid that may be received by each integrated antenna circuit. The resulting voltage swing on the resonant transmission network may be enhanced by modifying amplifier 700 to include a third transistor as discussed in U.S. application Ser. No. 11/622,813, filed Jan. 12, 2007, the contents of which are incorporated by reference. Regardless of the distributed amplifier design, the globally synchronized sinusoidal signal thereby produced may be received at impulse generators. These impulse generators may be advantageously incorporated in a wafer scale antenna module as will be discussed herein. However, it will be appreciated that the pulse generation, modulation, and control techniques disclosed herein are independent of the actual physical layer implementation used to transmit the resulting pulses. An exemplary integrated antenna circuit's impulse generator 1800 is illustrated in FIG. 3. The resonant transmission network is illustrated conceptually by oscillator 1805. An input voltage from oscillator 1805 is received at a rectifying driver amplifier 701a. Driver amplifier 701a may be constructed as discussed with regard to amplifier 700. However, to provide the desired rectification and level-shifting, the driver amplifier 701a is altered with regard amplifier 700 so as to operate in the saturation mode rather than in the linear mode as discussed in U.S. application Ser. No. 11/555,210 (the '210 application). Rectifying and level-shifting driver amplifier 701a differs from driver amplifier 700 in that the output voltage and the output capacitor couple between ground and the source (rather than the drain) of transistor Q1. Because transistor Q1 has approximately a diode drop of voltage across it (approximately 0.7 V), the output is then level-shifted this amount from VCC. The rectification comes about from the biasing of amplifier 701a such that it does not operate in the linear small-signal mode. Instead, amplifier 701a operates in the saturation mode. In this fashion, amplifier 701a shifts and rectifies its sinusoidal input signal into an output signal at a splitting junction 1810.

Amplifier 701a drives transmission lines TL1 and TL2 (such as CPW segments) arranged in parallel between splitting junction 1810 and a combining junction 1820. These transmission lines have different electrical lengths through appropriate configuration. For example, in a CPW embodiment, the widths of the corresponding CPW conductors are varied accordingly. Each transmission line segment ends in a level-shifting and rectifying combiner matching amplifier 1150 as also discussed in the '210 application. A second driver amplifier 701b receives the output signals from transmission lines TL1 and TL2 to provide an output pulse train signal. Loads 1850 and 1806 are constructed as discussed in the '210 application. It will be appreciated that because impulse generator 1800 uses two transmission lines TL1 and TL2, the resulting pulse train has pulse widths corresponding to less than half the frequency of the sinusoidal input signal. By using additional transmission lines, generator 1800 could achieve even narrower pulses but at the same pulse repetition rate as the input sinusoid frequency.

Figure 4:
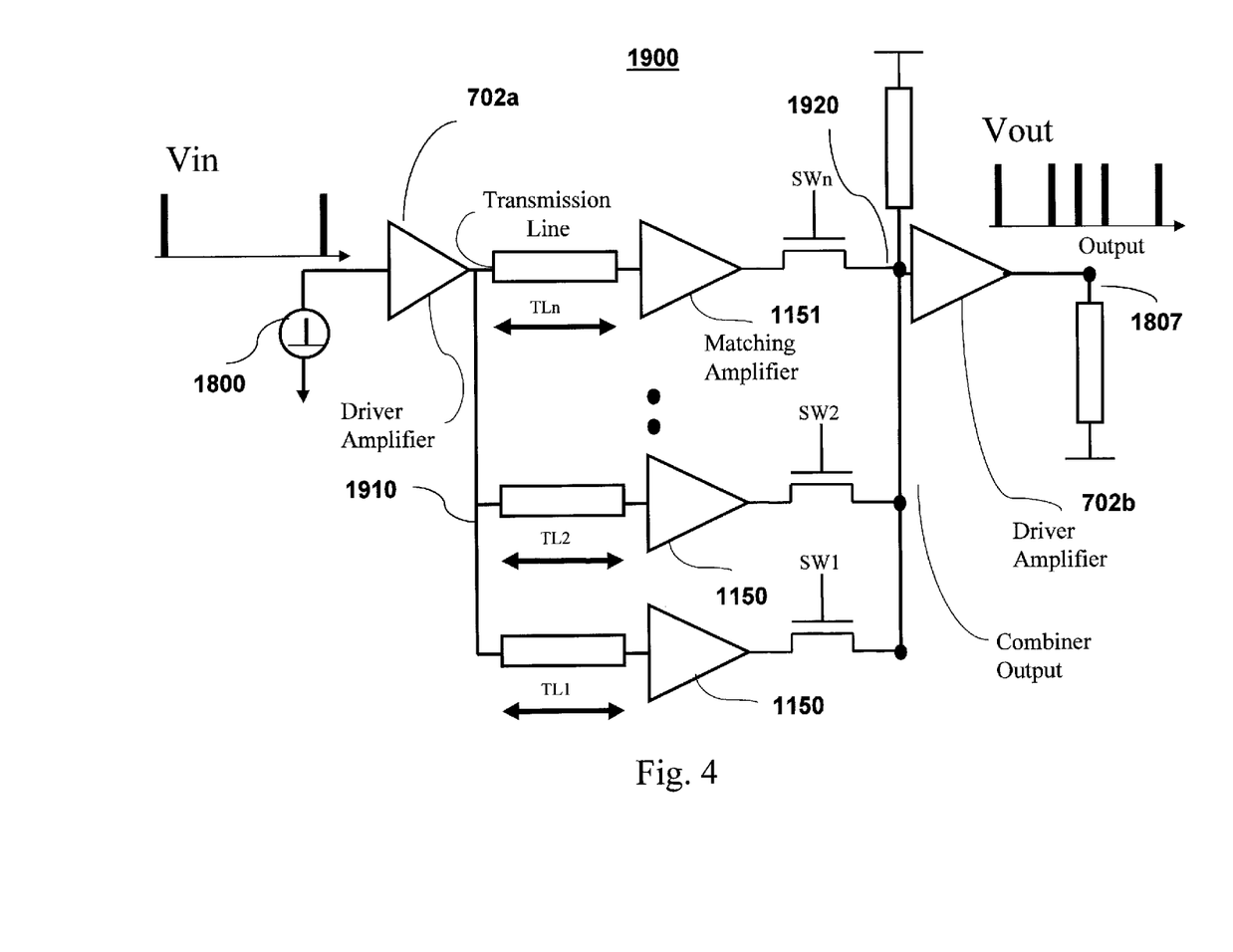
FIG. 4 is a schematic illustration of a pulse position modulator.

The pulse train provided by a impulse generator such as impulse generator 1800 may be modulated in a pulse position modulator 1900 illustrated in FIG. 4. A linear driver amplifier 702a as discussed in the '210 application drives an amplified pulse train into a splitting junction 1910. A plurality of n transmission lines TL1 through TLn couples between splitting junction 1910 and a combining junction 1920. Each transmission line has a different electrical length to produce a desired amount of delay and is received by a corresponding linear matching amplifier 1151 as discussed analogously in the '210 application. Each matching amplifier 1151 couples through a corresponding switch from switches SW1 through SWn to combining junction 1920. A second driver amplifier 702b amplifies the combined signal at combining junction 1920 into an output node.

Figure 5:
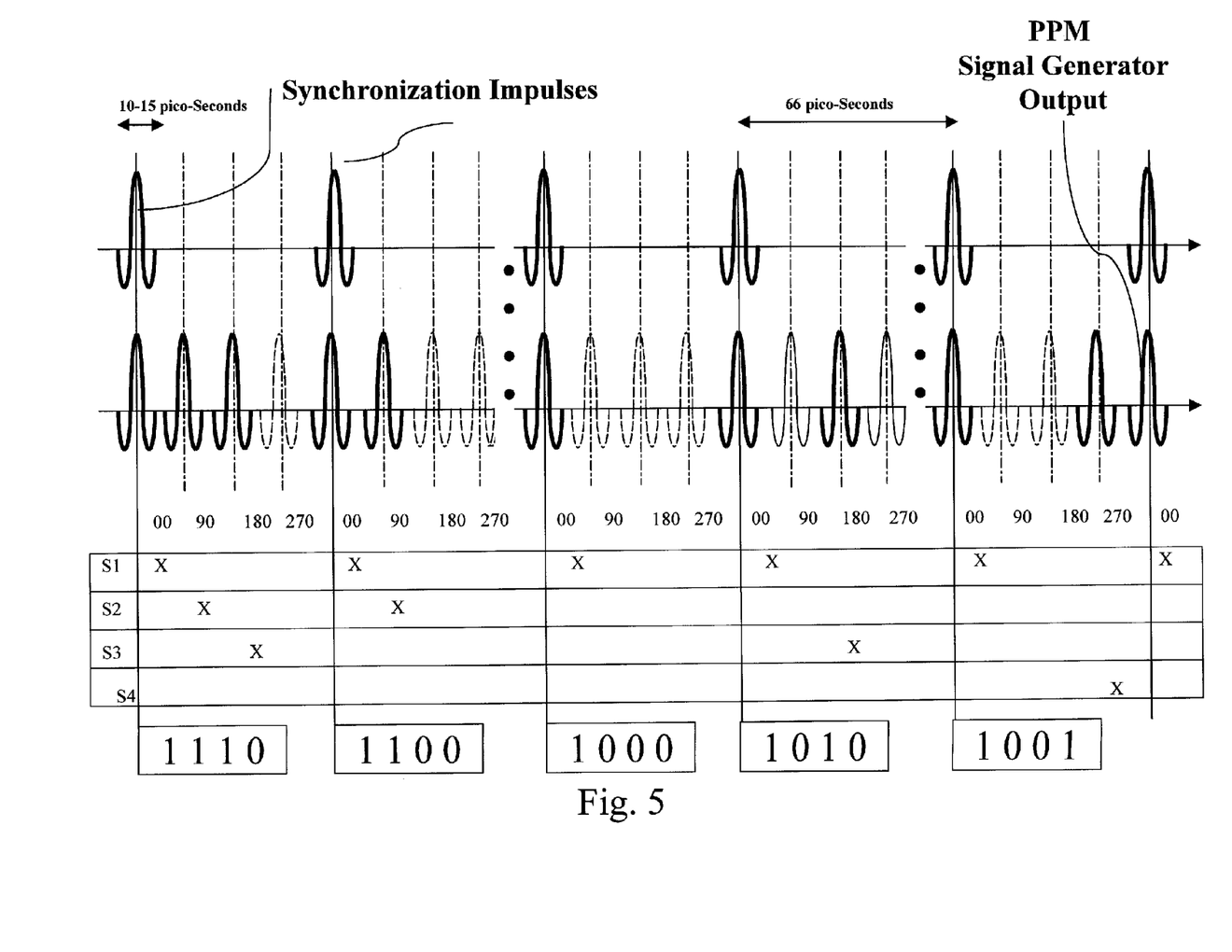
FIG. 5 is a graphic representation of pulses from the impulse generator and modulator of FIGS. 3 and 4.

In one embodiment, pulse position modulator 1900 may include four transmission line TL1 through TL4 and corresponding switches SW1 through SW4. Transmission line TL1 may have the shortest electrical length such that its matching amplifier output may be considered to have 0 degrees delay. The second transmission line TL2 may have a longer electrical length such that its matching amplifier output has 90 degrees of delay. Similarly, the third and fourth transmission lines may have greater and greater amounts of delay such that the corresponding matching amplifier outputs have 180 and 270 degrees of delay, respectively. The resonant transmission line may readily be made to oscillate at 15 GHz. An impulse generator 1800 receiving the resulting sinusoid may readily be constructed so as to produce a 15 GHz pulse repetition rate but with pulse widths of just 10 to 15 picoseconds. These input pulses are shown graphically in solid form in FIG. 5. If SW1 is left on, an output pulse of 0 degree delay (shown in phantom form in FIG. 5) is produced at the output node of the pulse position modulator. Analogous output pulses of 90, 180, and 270 degrees of delay are produced if the corresponding switches SW2 through SW4 are on (these pulses are also shown in phantom form in FIG. 5). These delayed pulses may be considered to occur in corresponding time bins. If an output pulse is provided in a time bin (such as for example, the time bin corresponding to the 0 degree delayed pulse), a binary one may be considered to have been transmitted. On the other hand, if a time bin (such as for example, the time bin corresponding to the 90 degree delayed pulse) is empty, a binary zero may be considered to have been transmitted. To keep synchronization in the receiver, switch SW1 may always be left on such that the corresponding 0 degree delayed pulse acts as a transmitted reference as known in the transmitted reference pulse position modulation schemes. Four possible symbols/words thus result: [1000], [1100], [1110], and [1111], corresponding to the transmission of 2 bits. In such a scheme, if the original pulse repetition rate is 15 GHz, a 30 GHz data rate is achievable. Should a transmitted reference not be used, four bits could be transmitted from each unmodulated pulse such that a 60 GHz data rate is achievable.

Figure 6:
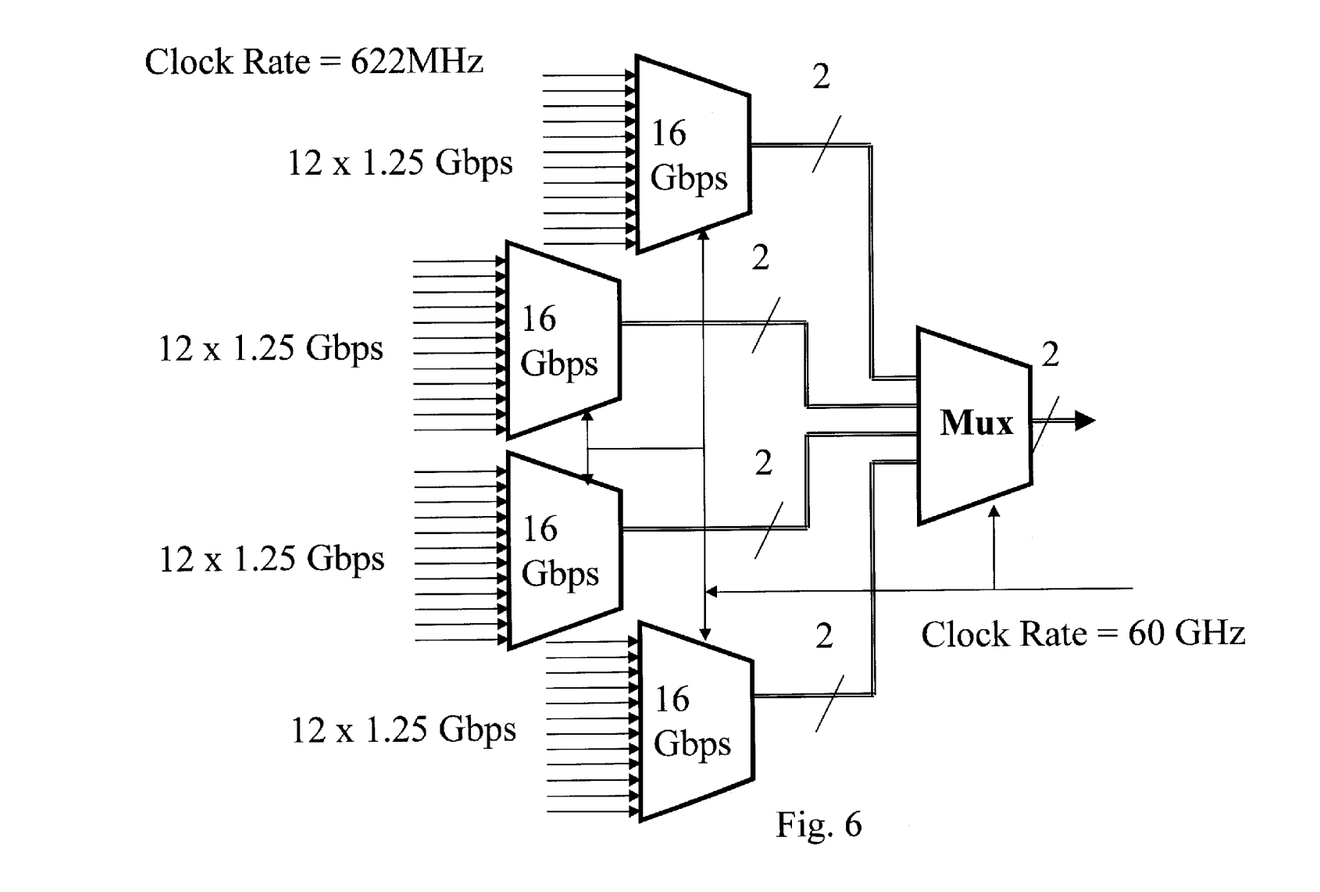
FIG. 6 illustrates the multiplexing of data streams to form a serial data stream.

The data to be transmitted using this pulse position modulation as well as beamforming commands and other information may be multiplexed as shown in FIG. 6. Four sets of 12×1.25 Gbps data streams may be multiplexed in 16 Gbps multiplexers. The output signal may be differential as illustrated or a single-ended embodiment may be used. The resulting four 16 Gbps data streams may then be multiplexed responsive to a 60 GHz clock rate to provide a single 60 Gbps serial data stream. This data stream may either be coupled through a wired or wireless near-field or far-field connection to a demultiplexer to be demultiplexed into four 16 Gbps data streams. These four 16 Gbps data streams may then be demultiplexed into 12×1.25 Gbps data streams.

Figure 7:
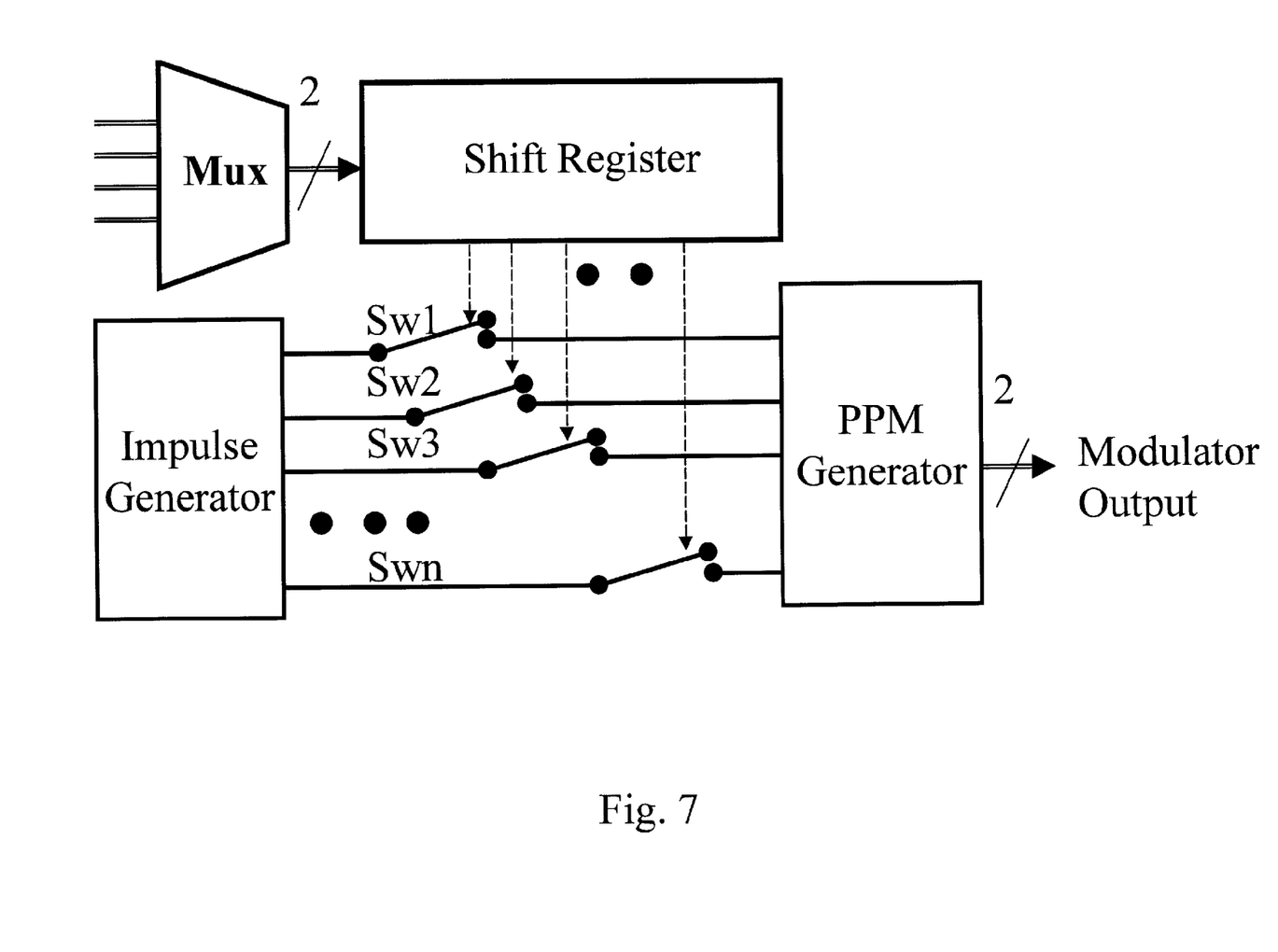
FIG. 7 is a block diagram of a system for mapping of the serial data stream of FIG. 6 into modulated pulses.

Regardless of the data rate in the resulting serial data stream, the serial bits may be mapped into the symbols (words) such as discussed above with regard to FIG. 5. Turning now to FIG. 7, the serial data stream such as that produced as discussed with regard to FIG. 6 is mapped into the corresponding words through a shift register that receives the words and drives the switches SW1 through SWN in pulse position modulator 1900 (FIG. 4) so as to provide the appropriate modulated pulses. In this fashion, extremely high data transmission rates such as 60 Gbps may be achieved that are simply unobtainable with other modulation schemes.

Figure 8:
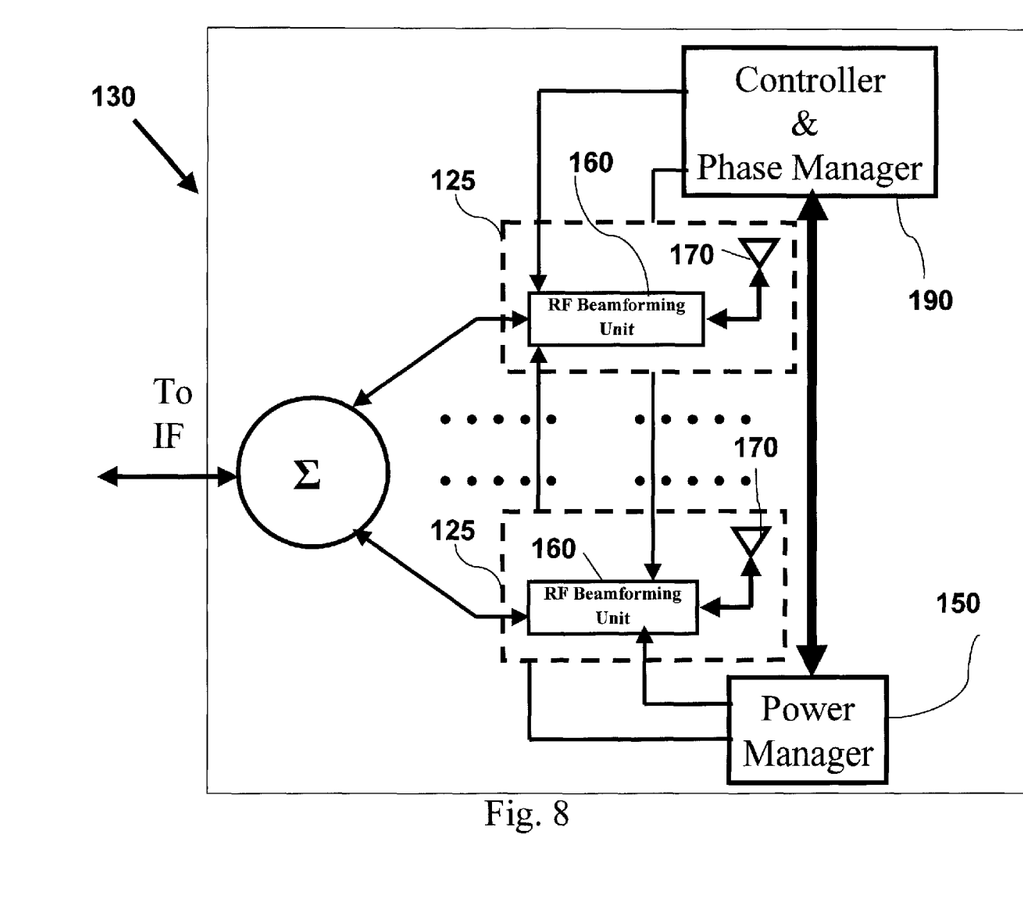
FIG. 8 is a block diagram of a beamforming antenna array in which the beamforming is performed in the RF domain.

Although the implementation of the pulse generation and pulse position modulation discussed herein is independent of the physical layer used to transmit the resulting modulated pulses, a wafer scale antenna module (WSAM) embodiment is advantageous because of the enhanced beamforming capabilities yet low cost of integrated circuit manufacture that it offers. Because the beamforming in a WSAM embodiment is performed in the RF domain, the baseband processor needs only a single channel of analog-to-digital conversion, thereby lowering cost and complexity. An exemplary embodiment of a wafer scale beamforming approach may be better understood with regard to the beamforming system of FIG. 8, which illustrates an integrated RF beamforming and controller unit 130. In this embodiment, the receive and transmit antenna arrays are the same such that each antenna 170 functions to both transmit and receive. A plurality of integrated antenna circuits 125 each includes an RF beamforming interface circuit 160 and receive/transmit antenna 170. RF beamforming interface circuit 160 adjusts the phase of the received RF signal from its antenna 170 responsive to control from a controller/phase manager circuit 190. In addition, in a transmit mode, RF beamforming interface circuit 160 receives the modulated pulse output train from a corresponding pulse position modulator 1900 (not illustrated) and adjusts the phase of the modulated pulse train before the phase-adjusted modulated pulse train is transmitted by the corresponding antenna 170. Although illustrated having a one-to-one relationship between beamforming interface circuits 160 and antennas 170, it will be appreciated, however, that an integrated antenna circuit 125 may include a plurality of antennas all driven by RF beamforming interface circuit 160.

Although the pulse train generation and pulse position modulation and associated control schemes discussed herein have been described with respect to particular embodiments, this description is only an example of certain applications and should not be taken as a limitation. Consequently, the scope of the claimed subject matter is set forth as follows.

I claim:

1. A circuit, comprising:
an impulse generator operable to provide a pulse train;
a pulse position modulator having a splitting junction configured to receive the pulse train, the pulse position modulator including a plurality of n transmission lines, wherein n is an integer, the n transmission lines being selectably coupled in parallel between the splitting junction and a combining junction, the impulse generator driving each transmission line having a unique delay such that if the transmission line is selected, each pulse received at the splitting junction is uniquely delayed into a delayed pulse, whereby if all the transmission lines are selected, each pulse received at the splitting junction is uniquely delayed into a corresponding plurality of n delayed pulses; and
an oscillator operable to provide a sinusoidal output signal, wherein the impulse generator includes a plurality of delay paths each having a unique delay, the impulse generator being configured to rectify and level shift the sinusoidal source output signal through the delay paths to provide the pulse train; and
a controller operable to select the transmission lines responsive to received words of n bits in length, each word arranged from a first bit to an nth bit, and wherein the transmission lines are arranged from a first transmission line to an nth transmission line corresponding to the bits in the received words such that a given bit in a received word controls the selection of the corresponding transmission line.

2. The circuit of claim 1, further comprising:
a plurality of n switches corresponding to the n transmission lines, each switch being configured such that if it is on, the corresponding transmission is coupled between the splitting junction and the combining junction.

3. The circuit of claim 2, wherein each switch comprises a transistor.

4. The circuit of claim 2, wherein each transmission line is a coplanar wave guide (CPW) transmission line.

5. The circuit of claim 1, wherein the plurality of delay paths are two delay paths.

6. The circuit of claim 1, wherein each delay path comprises a coplanar wave guide (CPW) transmission line.

7. A wafer scale antenna module (WSAM), comprising:
a substrate,
a plurality of antennas adjacent the substrate; and
an RF feed network adjacent the substrate, the RF feed network coupling to a distributed plurality of amplifiers integrated with the substrate, wherein the RF feed network and the distributed plurality of amplifiers are configured to form a resonant network such that if a timing signal is injected into an input port of the RF feed network, the resonant network oscillates to provide a globally synchronized RF signal to a plurality of integrated antenna circuits, wherein each integrated antenna circuit includes a corresponding subset of antennas from the plurality of antennas, and wherein each integrated antenna circuit includes:
an impulse generator having a plurality of delay paths, each delay path having a unique delay, the impulse generator being configured to rectify and level shift the globally synchronized RF signal through the delay paths to provide a pulse train;
a pulse position modulator having a splitting junction configured to receive the pulse train, the pulse position modulator including a plurality of n transmission lines, wherein n is an integer, the n transmission lines being selectably coupled in parallel between the splitting junction and a combining junction, the impulse generator driving each transmission line having a unique delay such that if the transmission line is selected, each pulse received at the splitting junction is uniquely delayed into a delayed pulse, whereby if all the transmission lines are selected, each pulse received at the splitting junction is uniquely delayed into a corresponding plurality of n delayed pulses; and a controller operable to select the transmission lines responsive to received words of n bits in length, each word arranged from a first bit to an nth bit, and wherein the transmission lines are arranged from a first transmission line to an nth transmission line corresponding to the bits in the received words such that a given bit in a received word controls the selection of the corresponding transmission line, wherein each integrated antenna circuit is operable to drive the delayed pulses from its pulse position modulator into its corresponding subset of antennas.

8. The WSAM of claim 7, wherein each integrated antenna circuit includes a phase shifter such that transmitted pulses from the antennas are driven into a desired beamforming direction.

9. The WSAM of claim 8, wherein the substrate is a semiconductor wafer substrate.

10. The WSAM of claim 8, wherein the RF feed network is implemented using waveguides selected from the group consisting of microstrip waveguides, co-planar waveguides, and planar waveguides.

11. The WSAM of claim 8, wherein the antennas are adjacent a first surface of the substrate and wherein the RF feed network is a co-planar waveguide network adjacent an opposing surface of the substrate, the controller being integrated into the opposing surface.

12. The WSAM of claim 11, wherein the co-planar waveguide network is formed in metal layers adjacent the opposing surface of the substrate.

13. The WSAM of claim 7, wherein the antennas are patch antennas.

14. The WSAM of claim 7, wherein the antennas are dipole antennas.

* * * * *